(12) United States Patent
Croot

(10) Patent No.: US 12,494,372 B2
(45) Date of Patent: Dec. 9, 2025

(54) PLASMA ETCHED SILICON CARBIDE

(71) Applicant: SPTS Technologies Limited, Newport (GB)

(72) Inventor: Alex Croot, Newport (GB)

(73) Assignee: SPTS Technologies Limited, Newport (GB)

(*) Notice: Subject to any disclaimer, the term of this patent is extended or adjusted under 35 U.S.C. 154(b) by 313 days.

(21) Appl. No.: 17/958,408

(22) Filed: Oct. 2, 2022

(65) Prior Publication Data

US 2023/0215732 A1    Jul. 6, 2023

(30) Foreign Application Priority Data

Dec. 30, 2021  (GB) ...................................... 2119119

(51) Int. Cl.
| | |
|---|---|
| H01L 21/3065 | (2006.01) |
| H01L 21/02 | (2006.01) |
| H01L 21/306 | (2006.01) |
| H01L 21/308 | (2006.01) |

(52) U.S. Cl.
CPC .... H01L 21/3065 (2013.01); H01L 21/02378 (2013.01); H01L 21/30617 (2013.01); H01L 21/3085 (2013.01)

(58) Field of Classification Search
None
See application file for complete search history.

(56) References Cited

U.S. PATENT DOCUMENTS

| | | |
|---|---|---|
| 9,722,070 B2 | 8/2017 | Wang et al. |
| 10,424,642 B2 | 9/2019 | Shiomi et al. |
| 2018/0204725 A1 | 7/2018 | Aichinger et al. |
| 2019/0164828 A1 | 5/2019 | Khaderbad et al. |
| 2021/0118986 A1 | 4/2021 | Aichinger et al. |

FOREIGN PATENT DOCUMENTS

| | | | |
|---|---|---|---|
| DE | 3829015 A1 | | 4/1989 |
| EP | 3836195 A1 | | 6/2021 |
| JP | 2007080982 | * | 3/2007 |
| JP | 2015099820 | | 5/2015 |
| JP | 2017195422 | * | 10/2017 |
| JP | 2021022642 | | 2/2021 |

OTHER PUBLICATIONS

IPO, Search Report for GB2119119.2, Jun. 29, 2022.
EPO, Extended European Search Report for EP Application No. 22189796.0, Apr. 5, 2023.

* cited by examiner

*Primary Examiner* — Stephanie P Duclair
(74) *Attorney, Agent, or Firm* — Hodgson Russ LLP

(57) ABSTRACT

A method of plasma etching a compound semiconductor substrate forms a feature. A first plasma etch step anisotropically etches the substrate through an opening to produce a partially formed feature having an opening and a bottom surface with a peripheral region. A second plasma etch step removes a region of the mask adjacent to the opening of the partially formed feature thereby causing rounding of the edges of the substrate at the opening of the partially formed feature. A third plasma etch step anisotropically etches the bottom surface of the partially formed feature through the opening of the mask while depositing a passivation material onto the mask and the opening of the partially formed feature to reduce a dimension of the opening of the partially formed feature. A plasma etch apparatus can be used to perform the method.

24 Claims, 6 Drawing Sheets

64  62  64

PLASMA ETCHED SILICON CARBIDE

CROSS-REFERENCE TO RELATED APPLICATIONS

This application claims priority to UK App. No. 2119119.2 filed Dec. 30, 2021, the disclosure of which is hereby incorporated by reference.

FIELD OF THE DISCLOSURE

This invention relates to a method of plasma etching a feature in a compound semiconductor substrate. This invention also relates to a plasma etching apparatus.

BACKGROUND OF THE DISCLOSURE

There is growing demand for high power and high frequency devices based on compound semiconductors which cannot be met by conventional silicon-based technology. In particular, wide band-gap compound semiconductors, such as silicon carbide (SiC), combine excellent electronic and thermal properties which can exceed those of silicon. However, fabricating such compound semiconductor devices in high volumes at an acceptable cost using known methods can be challenging, often requiring many processing steps. It is desirable to develop a method to fabricate compound semiconductor devices, such as SiC devices, in a more economical way with fewer processing steps.

Power device silicon carbide trenches are finding an increasing number of applications in power semiconductor devices. It is known to use flat-based trenches, wherein the trench 10 has a substantially flat bottom surface 12 with substantially perpendicular sidewalls 14, as shown in FIG. 1. However, micro-trenching at the bottom of flat-based trenches can cause problems. Micro-trenching refers to deeper etched sections at the corners of the trench. The acute angles inherent in micro-trenches can cause electric fields within the substrate to be concentrated at these locations, which can lead to reduced breakdown voltages. It is desirable to avoid micro-trenching; and to maximise the breakdown voltage.

Even in flat-bottomed tranches (without micro-trenching), the electric field is susceptible to "field bunching". That is, the electric field is susceptible to concentrating at a particular location within the trench, such as at the corners of trench. It is therefore desirable to minimise field bunching as far as possible by being able to control the curvature of the corners to the trench.

Dry etched silicon carbide trenches typically having a width of between 1 and 10 μm and a depth of between 1 and 3 μm find growing use in power semiconductor devices. The industry commonly uses trenches with substantially perpendicular sidewalls, as shown in exemplary trench 16 of FIG. 2, with a lack of micro-trenching being a primary material requirement. The acute angles inherent in micro-trenches can cause electric fields within the material to be concentrated at the trench corner and lead to reduced breakdown voltages. Even trench structures as in 16 can pose problems with field-bunching at both the base and the top of the trench. Trenches with rounded corners have far more dispersed internal fields, increasing the breakdown voltage and meaning round-cornered trenches, as shown in exemplary trench 18 of FIG. 2, will out-perform square-cornered alternatives in many devices.

Current methods to produce base and top corner rounding are either based on furnace processes or wet etch steps following the formation of the trench, typically following the removal of the mask. U.S. Ser. No. 10/424,642 B2 discloses that after the plasma-based anisotropic trench etch step and SiO$_2$ mask removal, the wafer is annealed in a furnace in a H$_2$ gas atmosphere at a temperature of between 1350° C. and 1605° C. to produce the required degree of edge rounding. Similarly, US 2021/0118986 A1 discloses rounding of top and bottom corners of a trench in a SiC substrate using a H$_2$ annealing process at about 1520° C. U.S. Pat. No. 9,722,070 discloses that either a sacrificial oxide deposition step followed by removal or an undefined wet etch step can be used to produce the trench edge rounding.

A plasma etch process to produce round-based trenches has also been suggested. In U.S. Ser. No. 10/424,642 B2, a "sub trench suppressing film" is used to control the curvature at the base of the trench. However, it is disclosed that base and top rounding can be further improved through the use of a furnace anneal. EP 3836195 discloses a two-step process for rounding the base of the trench. A first step produces a deep trench, with the second step producing the required degree of base rounding. This provides a round-based trench, but it does not address the top of the trench as this is protected by the hard mask. While it is known in the art that plasma-based methods can achieve some degree of corner rounding at the base of the trench, furnace or wet etch techniques are required to modify the top corner of the trench. As the furnace technique can simultaneously achieve base and top corner rounding, when the hard mask has been removed, there is limited value in employing a dry etch rounding of the base if the top corner of the trench also has to be rounded. Therefore, there is a need in the art for a plasma etch method which can etch the SiC trench and round the top and base of the trench whilst avoiding the use of a furnace for corner rounding.

BRIEF SUMMARY OF THE DISCLOSURE

The present invention, in at least some of its embodiments, seeks to address the above-described problems, desires and needs. In particular, the present invention seeks to provide a method for controlling the profile at the bottom and top of trenches in order to better disperse the internal electric fields within a trench, and to increase breakdown voltages. For example, at least some embodiments of the present invention provide a method for controllably forming trenches with a base having rounded corners or a rounded profile and a top having rounded corners or a rounded profile.

According to a first embodiment of the present invention there is provided a method of plasma etching a compound semiconductor substrate to form a feature, the method comprising the steps of:
  providing a substrate with a mask formed thereon, the mask having an opening, wherein the substrate is formed from a compound semiconductor material;
  performing a first plasma etch step to anisotropically etch the substrate through the opening to produce a partially-formed feature having an opening and a bottom surface comprising a peripheral region;
  performing a second plasma etch step to remove a region of the mask adjacent to the opening of the partially-formed feature and thereby cause rounding of the edges of the substrate at the opening of the partially-formed feature; and
  performing a third plasma etch step to anisotropically etch the bottom surface of the partially-formed feature through the opening of the mask while depositing a passivation material onto the mask and the opening of the partially-formed feature so as to reduce a dimension of the opening of the partially-formed feature, wherein the reduction of the dimension of the opening of the partially-formed feature causes an attenuation in etching of the peripheral region and the opening of the partially-formed feature thereby producing a fully formed feature having an opening with rounded edges, a bottom surface comprising a central region and an edge region, wherein the central region is deeper than the edge region of the bottom surface of the fully formed feature.

Without wishing to be bound by any theory or conjecture, it is believed that the second plasma etch causes removal of the mask around the opening of the partially-formed feature, allowing the edges of the substrate at the opening of the partially-formed feature to be rounded by etching from exposure to the plasma. Subsequently, the passivation material that deposits onto the mask and the opening of the partially-formed feature to reduce the dimension of the opening protects the rounded edges of the substrate at the opening of the partially-formed feature as well as the peripheral region of the partially-formed feature from the distribution of species in the plasma during the third plasma etch step. Consequently, at the bottom surface of the feature, the amount of material removed from the peripheral region during the third plasma etch step is less than the amount of material removed from the central region, whilst at the opening of the feature, the rounded edges of the substrate are prevented from being etched further by the plasma due to the deposition of the passivation material. Controlling the reduction in dimension of the opening during the third plasma etch step allows the profile at the bottom of the feature to be controlled and formed into a desired shape. The present method allows features to have rounded, curved or otherwise smooth surfaces (i.e. gradual changes in slope), which can improve the dispersion of electric fields in the feature and can help to minimise field bunching. Consequently, the present method can help to produce features having a high breakdown voltage. Additionally, the method can help to avoid the formation of micro-trenches forming in the edge region of the bottom surface (e.g. the corners) of the feature.

The compound semiconductor material can be silicon carbide (SiC). The substrate can be a SiC wafer. The substrate can be a 150 mm SiC wafer.

The second plasma etch step can include using an etch recipe comprising a fluorocarbon-based etchant, such as a fluorinated gas. The fluorocarbon-based etchant can comprise $CF_4$, $CHF_3$ or $C_4F_8$. The fluorocarbon-based etchant can comprise, consist of or consist essentially of $CF_4$. A bias power applied to the substrate during the second plasma etch step can be between about 350 W and about 1000 W. A bias power applied to the substrate during the second plasma etch step can be between about 350 W and about 800 W. A bias power applied to the substrate during the second plasma etch step can be about 600 W. The bias power can be an RF bias power. A plasma source power applied to the substrate during the second plasma etch step can be between about 1000 W and about 2000 W. A plasma source power during the second plasma etch step can be about 1600 W. The second plasma etch step can be carried out at a pressure of between about 2 mTorr and about 10 mTorr. The second plasma etch step can be carried out at a pressure of about 4 mTorr.

The passivation material can be deposited onto the mask and a sidewall of the feature being etched. The net deposition rate of the passivation material throughout the third plasma etch step can be greater than zero. The passivation material can be deposited at a deposition rate that increases during the third plasma etch step. The deposition rate of the passivation material can increase during the third plasma etch step at an increasing rate of change. The dimension of the opening in the mask can reduce at an increasing rate of change. Increasing the deposition rate of the passivation material during the third plasma etch step can help to produce a feature having rounded corners in the edge region of the bottom surface. For example, the feature can be a generally flat-bottomed U-shape. The passivation material can have a deposition thickness that increases to about 300 nm, optionally about 250 nm, optionally about 175 nm, optionally about 150 nm, or optionally about 125 nm on each side of the opening. The dimension of the opening in the mask layer can be reduced by a distance of about 100 to 600 nm, 200 to 500 nm, 250 to 450 nm, 300 to 400 nm, or about 350 nm or any combination of these upper and lower limits.

The third plasma etch step can comprise varying a process parameter during the third plasma etch step. The third plasma etch step can comprise ramping a process parameter during the third plasma etch step. For example, the third plasma etch step can comprise varying or ramping at least one of a gas mixture composition, a gas flow rate, a processing time, a plasma source power, a bias power applied to the substrate, and/or a frequency. Any other process parameter can be varied or ramped during the third plasma etch step. This can help to control the etch rate of the substrate through the opening whilst also controlling the deposition rate of the passivation material.

The process parameter that is varied can be ramped at an increasing rate of change. The process parameter that is varied can be ramped at a constant rate of change. The term "ramping" can mean either systematically increasing or systematically decreasing a value.

Varying the process parameter can comprise varying a flow rate of a passivation material precursor during the third plasma etch step.

The flow rate of the passivation material precursor can be increased during the third plasma etch step. The flow rate (in sccm) of the passivation material precursor at the end of the third plasma etch step can be at least two times, three times or four times higher than the flow rate (in sccm) of the passivation material precursor at the start of the third plasma etch step. The flow rate of the passivation material precursor can be increased from about 25 sccm to about 100 sccm.

The substrate can be disposed in a chamber. The method can comprise introducing a passivation material precursor into the chamber at a flow rate that is higher during the third plasma etch step compared to the first plasma etch step. The third plasma etch step can comprise introducing a passivation material precursor into the chamber at a flow rate, wherein the flow rate of passivation material precursor introduced into the chamber during the third plasma etch step can be higher than a flow rate of passivation material precursor introduced into the chamber during the first plasma etch step.

The passivation material precursor can comprise an oxygen-containing gas, such as $O_2$.

Varying the process parameter can comprise varying a bias power applied to the substrate during the third plasma etch step. The bias power applied to the substrate can be decreased during the third plasma etch step. The bias power applied to the substrate at the start of the third plasma etch step can be higher than the bias power applied to the substrate at the end of the third plasma etch step by an amount in the range of about 50 to 300 W. The bias power applied to the substrate at the start of the third plasma etch step can be a power in the range of about 230 to 500 W, 240 to 350 W or about 250 W. The bias power applied to the substrate at or towards the end of the third plasma etch step can be a power in the range of about 140 to 220 W, about 170 to 210 W, or about 190 W. Alternatively, the bias power applied to the substrate during the third plasma etch step can be maintained at a constant value throughout the third plasma etch step. The bias power applied to the substrate during the third plasma etch step can be between 140 W and 220 W. The bias power applied to the substrate during the third plasma etch step can be about 180 W. The bias power applied to the substrate during the third plasma etch step can be lower than the bias power applied to the substrate during the first plasma etch step. The bias power applied to the substrate during the first plasma etch step can be in the range of about 100 to 1600 W, or about 400 to 1400 W.

The passivation material can comprise a silicon oxide, such as $SiO_2$. The passivation material is typically more resistant to the plasma etch process compared with the compound semiconductor material of the substrate. The etch selectivity between the substrate material and the passivation material can be in a range of about 2:1 to about 4:1. The passivation material and the mask can be made of substantially the same material. The mask can comprise a silicon oxide, such as $SiO_2$.

The first plasma etch step can include using an etch recipe comprising a chlorine-based etchant, such as $Cl_2$ and/or $SiCl_4$. The first plasma etch step can include an etch recipe comprising a fluorine-based etchant, such as a fluorinated gas. The etch recipe used for the first plasma etch step can consist of or consist essentially of one or more gases selected from the group: a chlorine-based etchant (e.g. $Cl_2$ and/or $SiCl_4$), an oxygen-containing gas (e.g. $O_2$), $H_2$ and/or Ar gas.

The third plasma etch step can include using an etch recipe comprising a chlorine-based etchant. The chlorine-based etchant can comprise $Cl_2$ and/or $SiCl_4$. The third plasma etch step can include an etch recipe comprising a fluorine-based etchant, such as a fluorinated gas. The etch recipe used for the third plasma etch step can comprise using one or more gases selected from a chlorine-based or fluorine-based etchant, $O_2$, $H_2$ and/or Ar gases. The etch recipe used for the third plasma etch step can consist of or consist essentially of one or more gases selected from the group: a chlorine-based etchant (e.g. $Cl_2$ and/or $SiCl_4$), an oxygen-containing gas (e.g. $O_2$), $H_2$ and/or Ar gas. The third plasma etch step can include using an etch recipe consisting of or consisting essentially of: the chlorine-based etchant, such as $Cl_2$ and/or $SiCl_4$; an oxygen-containing gas, such as $O_2$ gas; optionally $H_2$ gas; and optionally Ar gas. The etch recipe used for the first plasma etch step can be different to the etch recipe used for the third plasma etch step. For example, the ratio of the gases used in the etch recipe for the third plasma etch step can be different to the ratio of gases used in the etch recipe for the first plasma etch step. The etch rate of the first plasma etch step can be higher than the etch rate of the third plasma etch step. Where $SiCl_4$ (or other silicon-containing gas) is used in the third plasma etch step, the flow rate of the silicon-containing gas (e.g. $SiCl_4$) in sccm can be more than about 50%, optionally between about 55% and 90% of the total gas flow rate in sccm.

The method of the first embodiment of the invention can further comprise a passivation step after the second plasma etch step and before the third plasma etch step, wherein the passivation step comprises depositing a passivation material onto the edges of the substrate at the opening of the partially-formed feature. This additional passivation step can more finely control the protection of the rounded edges of the substrate at the opening of the partially-formed feature without constricting the opening of the partially-formed feature and eliminating the base rounding.

The passivation material deposited during the passivation step can be the same as the passivation material deposited during the third plasma etch step.

A bias power applied to the substrate during the passivation step can be lower than a bias power applied to the substrate at the beginning of the third plasma etch step. The bias power applied to the substrate during the passivation step can be lower than a bias power applied to the substrate throughout the third plasma etch step.

The passivation step can include using a gas composition comprising an oxygen-containing gas, optionally $O_2$. The passivation step can include using a gas composition comprising a chlorine-containing gas. The chlorine-containing gas can be $SiCl_4$. The passivation step can include using a gas composition comprising $H_2$ gas and/or Ar gas. The gas composition used for the passivation step can consist of or consist essentially of one or more gases selected from the group: a chlorine-based etchant (e.g. $SiCl_4$), an oxygen-containing gas (e.g. $O_2$), $H_2$ and/or Ar gas.

A plasma source power applied in the passivation step can be higher than a plasma source power applied in the third plasma etch step. A plasma source power applied in the passivation step can be between about 1500 W and 2000 W. A plasma power applied in the passivation step can be about 1850 W.

The bottom surface of the partially-formed feature can be substantially flat. The bottom surface of the partially-formed feature can be substantially convex.

The feature can be a trench. The feature can be a via.

The dimension of the opening in the mask during the first plasma etch step can be in a range of about 0.5 µm to 20 µm or about 1 µm to 10 µm. The dimension of the opening can remain substantially constant during the first plasma etch step. The dimension of the opening can be a width. The feature can have a maximum width in the range of about 0.5 µm to 20 µm or about 1 µm to 10 µm. The feature can have a depth in the range of about 0.5 µm to 10 µm, 0.75 µm to 5 µm, or about 1 µm to 3 µm.

The bottom surface of the fully formed feature can be substantially concave. The term "substantially concave" is used here to mean a shape in which it is possible to draw a line segment between two points on opposite sides of the bottom surface (e.g. from opposing edge regions) without intersecting the substrate (i.e. having a central region that is deeper than the edge region). This definition includes a concave profile comprising a flat central region. This definition includes a concave profile having tapered corners. The present invention allows the profile of the bottom surface to be tailored as desired by the user.

The central region of the bottom surface of the fully formed feature can be substantially flat.

The edge region can provide a continuous change in slope from the central region to a substantially perpendicular sidewall of the feature. The edge region can extend from the sidewall of the feature by a distance in the range of about 100 nm to about 350 nm, about 125 nm to about 300 nm, about 150 nm to about 250 nm, or optionally about 175 nm. The edge region of the bottom surface of the fully formed feature can comprise a curved surface. The edge region can form a rounded corner between the central region of the bottom surface and a sidewall of the fully formed feature. The edge region can form a tapered corner between the central region of the bottom surface and a sidewall of the fully formed feature. The sidewall is typically substantially perpendicular to the central region of the bottom surface of the fully formed feature. The sidewall can be inclined at an angle of 85-90°, 86-90°, 87-90°, 88-90°, or 89-90° with respect to the central region of the bottom surface.

The method can further comprise:
selectively removing the passivation material from the substrate by wet etching.

The wet etching can be performed using a HF wet etchant. Alternatively, the method can further comprise:
selectively removing the passivation material from the substrate by dry etching.

The first plasma etch step, the second plasma etch step and the third plasma etch step can be performed using an inductively coupled plasma (ICP) etch apparatus. The passivation step can also performed using an inductively coupled plasma (ICP) etch apparatus.

According to a second embodiment of the present invention there is provided a plasma etch apparatus for plasma etching a substrate to form a feature using the method of the first embodiment of the present invention, the apparatus comprising:
a chamber;
a substrate support disposed within the chamber for supporting a substrate thereon;
at least one gas inlet for introducing a gas or gas mixture into the chamber at a flow rate;
a plasma generating means for sustaining a plasma in the chamber;
a power supply for supplying a bias power to the substrate support; and
a controller configured to switch between a first set of processing conditions, a second set of processing conditions and a third set of processing conditions, wherein the first set of processing conditions are configured to perform a first plasma etch step to anisotropically etch the substrate through the opening to produce a partially-formed feature having an opening and a bottom surface comprising a peripheral region, the second set of processing conditions are configured to perform a second plasma etch step to remove a region of the mask adjacent to the opening of the partially-formed feature and cause rounding of the edges of the substrate at the opening of the partially-formed feature, and the third set of processing conditions are configured to perform a third plasma etch step to anisotropically etch the bottom surface of the partially-formed feature through the opening of the mask while depositing a passivation material onto the mask so as to reduce a dimension of the opening of the partially-formed feature, wherein the reduction of the dimension of the opening of the partially-formed feature causes an attenuation in etching of the peripheral region and the opening of the partially-formed feature thereby producing a fully formed feature having an opening with rounded edges, a bottom surface comprising a central region and an edge region, wherein the central region is deeper than the edge region of the bottom surface of the fully formed feature.

The controller can be further configured to switch between the first to third set of processing conditions and an additional set of processing conditions, wherein the additional set of processing conditions are configured to deposit a passivation material onto the edges of the substrate at the opening of the partially-formed feature.

For the avoidance of doubt, whenever reference is made herein to 'comprising' or 'including' and like terms, the invention is also understood to include more limiting terms such as 'consisting' and 'consisting essentially'.

Whilst the invention has been described above, it extends to any inventive combination of the features set out above, or in the following description, drawings or claims. For example, any features disclosed in relation to the first embodiment of the invention may be combined with any features of the second embodiment of the invention and vice versa.

DESCRIPTION OF THE DRAWINGS

Aspects of methods and apparatuses in accordance with the invention will now be described with reference to the accompanying drawings, in which.

DETAILED DESCRIPTION OF THE DISCLOSURE

Figure 3:
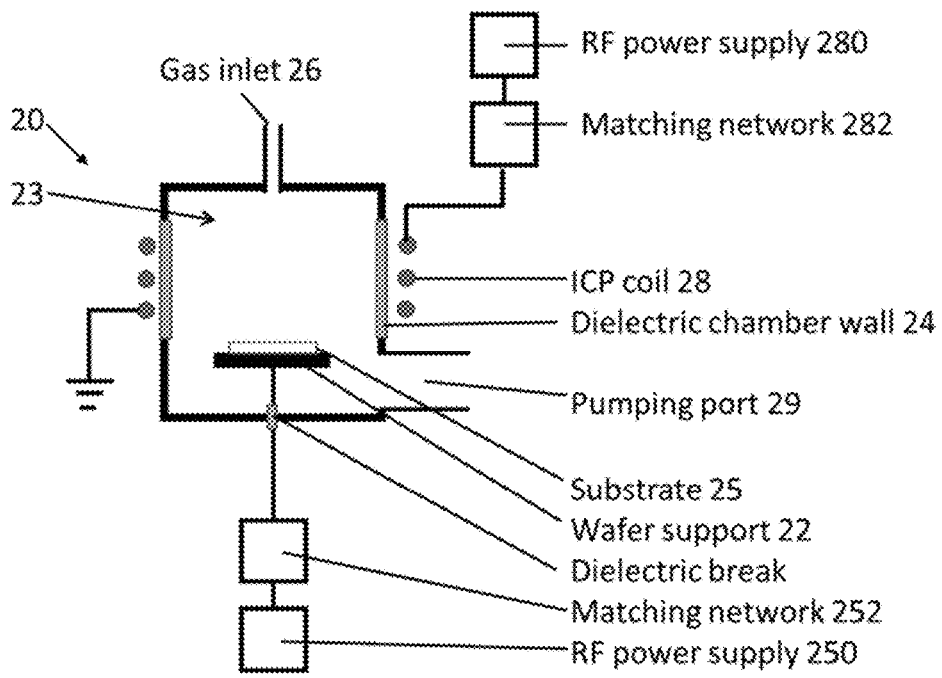
FIG. 3 is a cross-sectional schematic view of a plasma etch apparatus in accordance with a second embodiment of the present invention suitable for performing a method according to a first embodiment of the invention.

FIG. 3 shows a schematic representation of a plasma etch apparatus 20 in accordance with the second embodiment of the invention suitable for performing methods according to the first embodiment of the present invention. Plasma etching of a substrate is performed using a suitable plasma etch apparatus. The plasma etch apparatus can be an inductively coupled plasma (ICP) apparatus. However, etching can also be performed using other dry etch systems, such as helicon, RIE or microwave type apparatus. The operation of generating a plasma within such plasma etch apparatus is well-known in the art and will not be described here other than where necessary for an understanding of the present invention.

A plasma etching tool suitable for performing the method of the present invention is a modified Omega® Synapse™ available from SPTS Technologies Limited of Newport, UK. A plasma etch apparatus 20 typically comprises a substrate support (or platen) 22 disposed within a chamber 23 for supporting a substrate 25. A bias power can be supplied to the substrate by a RF power supply 250 via an impedance matching network 252. Typical RF frequencies for operation of the RF power supply may be between about 380 kHz and 13.56 MHz. The chamber can comprise a chamber wall having a dielectric part 24. Process gases can be introduced into the chamber via one or more gas inlets 26. A plasma generating means 28, such as an inductive coil, can be used to generate and sustain a plasma within the chamber 23 as is known in the art (e.g. using a RF power supply 280 and impedance matching network 282). The gases can be removed from the chamber 23 via a pumping port 29. Also provided is a controller (not shown) which is configured to control the apparatus to perform the process sequence described herein. The controller typically comprises a programmable processor, which is programmed in software and/or firmware to carry out the functions that are described herein, along with suitable digital and/or analog interfaces for connection to the other elements of the apparatus. Alternatively or additionally, the controller comprises hard-wired and/or programmable hardware logic circuits, which carry out at least some of the functions of the controller. The controller may comprise a single control unit or multiple, interconnected control units, with suitable interfaces for receiving and outputting the signals that are illustrated in the figures and are described herein. Program code or instructions for the controller to implement various methods and functions disclosed herein may be stored in readable storage media, such as a memory in the controller or other memory.

Figure 4:
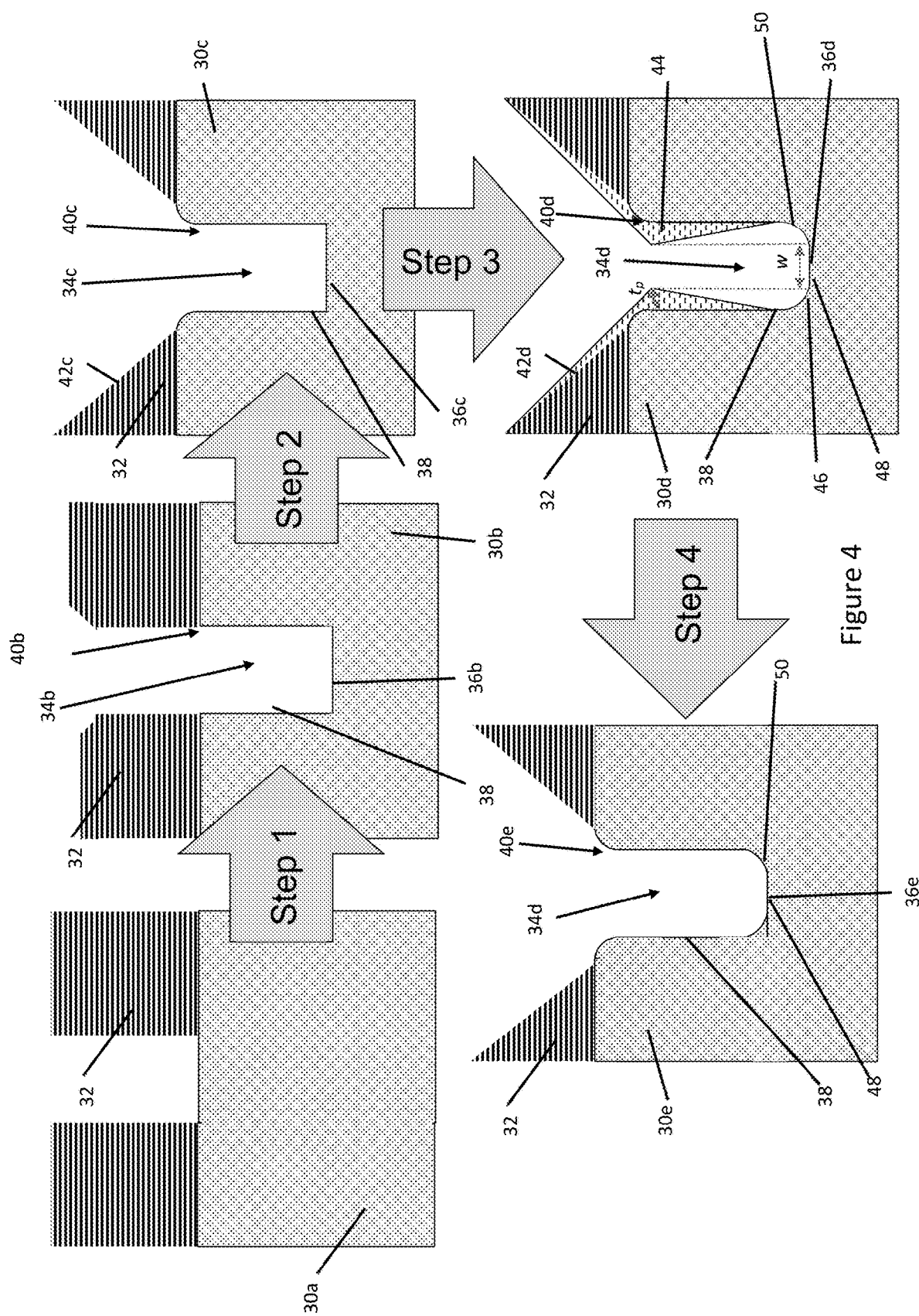
FIG. 4 is a schematic cross-sectional view of a substrate at various stages of processing in accordance with a first aspect of the first embodiment of the invention.

FIG. 4 shows the stages of an exemplary method according to a first aspect of the first embodiment of the present invention. In the first aspect, a compound semiconductor substrate 30 is etched to form a feature having rounded corners at the base of the feature and rounded edges at the opening of the feature. In the first aspect, the feature is a trench, and the substrate 30 is a 150 mm silicon carbide (SiC) wafer. However, other features may be formed and other compound semiconductor substrates can alternatively be used in the method of the first aspect of the first embodiment of the present invention. Other wafer sizes may also be used in the method of the first aspect of the first embodiment of the present invention. Although the parameters stated below are those used for the etching of a 150 mm SiC wafer, they may be varied with the size of the wafer in a manner known in the art. The substrate 30 includes a patterned mask layer 32, such as a silicon dioxide ($SiO_2$) layer or other suitable mask layer. The mask layer 32 is typically more resistant to the plasma etch conditions that the bulk substrate material.

The substrate 30 to be etched is positioned on the substrate support 22 in a plasma etch apparatus 20 with the face to be etched facing upwards. A pre-etch may optionally be performed to prepare the substrate 30 prior to the first plasma etch, for example to remove unwanted material from the open areas of the mask layer 32.

A first plasma etch step is performed to selectively etch the SiC substrate 30a so that a majority of the trench is formed. Numeral 34b represents the partially-formed trench. The first plasma etch step corresponds to "Step 1" of FIG. 4. The first plasma etch step anisotropically etches the substrate 30a through the opening. A bias power is applied to the platen 22 during the first plasma etch step. For example, the bias power applied to the platen can be in the range of about 100 W to about 1400 W, optionally about 1000 W. This helps to impart a directionality to the species (e.g. ions) in the plasma so that the base 36b of the partially-formed trench 34b is preferentially etched (rather than the sidewalls 38 of the trench).

Consequently, the width of the partially-formed trench 34b substantially corresponds to the initial width of the open area in the mask layer 32.

During the first plasma etch step, the chamber pressure can be in the range of about 2 mTorr to about 20 mTorr. Preferably, the chamber pressure can be in the range of about 2 mTorr to about 8 mTorr. During the first plasma etch step, the plasma source power can be in the range of about 800 W to about 2400 W, optionally about 1000 W to about 2000 W. During the first plasma etch step, the bias power applied to the substrate can be a RF bias power. RF frequencies for the RF bias power can be between about 2 MHz and about 13.56 MHz. Typically, the walls of the chamber 23 are cooled by water to about 55° C. with a platen 22 temperature setpoint of 20° C. By way of example only, the process gases used in the first plasma etch step can comprise one or more of $Cl_2$, $SiCl_4$, $O_2$, $H_2$ and/or Ar gas. Fluorinated etchant gases, such as fluorocarbons, can also be used.

The first plasma etch step results in the formation of a partially-formed trench 34b. The partially-formed trench 34b comprises a flat base 36b that is approximately perpendicular to the sidewalls 38 of the trench 34b and an opening 40b adjacent to the surface of the substrate 30b on which the mask 32 is formed. The flat base 36b has a peripheral region (not labelled) proximate to the sidewall 38. If micro-trenching has occurred, the partially-formed trench may comprise a substantially convex shape.

The substrate 30b is then subjected to a second plasma etch step, shown as "Step 2" in FIG. 4. The plasma processing parameters used during the second plasma etch step are different to those used during the first plasma etch step. The second plasma etch step is an anisotropic plasma etch step carried out at a lower source power and substrate bias than used for the first plasma etch step. In this example, the species forming the plasma generally bombard the substrate substantially perpendicularly to the substrate surface. This has the effect of causing the mask 32b to attenuate or recede, due to etching by the plasma. In the illustrated embodiment shown in FIG. 4, material making up the mask 32 is removed from the uppermost surface of the mask 32 in the region adjacent to the opening 40c in the substrate 30c to form an inclined surface 42c. The second plasma etch step also etches the edges of the substrate 30c at the opening 40c of the trench 34c to cause rounding of the edges of the substrate 30c at the opening 40c of the trench 34c. Without wishing to be bound by any theory or conjecture, it is believed that the mask 32 is etched from the edge of the substrate 30c at the opening 40c of the trench 34c first. As the mask 32 is gradually removed, more of the substrate is exposed. The surface of the substrate 30c on which the mask 32 is formed is the last point to be exposed to the plasma, and therefore it etched the least. This gradual exposure will result in a tapered or curved edge of the opening 40c of the trench 34c.

The anisotropic etching process may also cause further etching of the base 36c of the trench 34c, as shown in FIG. 4. This further etching may affect the surface orientation of the base, for example such that it is no longer flat. However, in the illustrated embodiment shown in FIG. 4, the flat base 36c after etching remains flat, and still includes a peripheral region (not labelled) proximate to the sidewall 38.

The substrate 30c is then subjected to a third plasma etch step, shown as "Step 3" in FIG. 4, in which the trench is fully formed. The plasma processing parameters used during the third plasma etch step are different to those used during the first plasma etch step and the second plasma etch step. The third plasma etch step is an anisotropic plasma etch step that is carried out at a substrate bias level lower than that used for the first two plasma etch steps. Directionality of the etch front is achieved through the control of sidewall passivation and plasma conditions. Consequently, the bottom surface 36d of high aspect ratio features 34d can be etched without significant etching of the sidewalls 38.

The third plasma etch step anisotropically etches the bottom surface 36d of the partially-formed trench 34d. Simultaneously, a passivation material 44 is deposited onto a surface 42d of the mask 32, the opening 40d of the trench 34d and also the sidewall 38 of the trench 34d being etched (FIG. 4). The passivation material 44 can be a silicon oxide, such as $SiO_2$. The passivation material 44 and the mask 32d can be made from the same material. Without wishing to be bound by any theory or conjecture, it is believed that the thickness ($t_p$) of the passivation material 44 gradually increases during the third plasma etch step, which has the effect of gradually reducing a dimension in the opening 40d of the trench 34d. The dimension can be a critical dimension, and can correspond to the minimum width (w) of the opening of the trench 34d. This dimension can substantially correspond to the width on the bottom surface of the trench 34d that is etched. As the dimension of the opening is reduced, the etching at the peripheral region 46 is attenuated. The change in the dimension w translates to a reduction in the etched width at the base 36d of the trench 34d. Without wishing to be bound by any theory or conjecture, it is believed that the passivation material 44 overhangs the corners of the base 36d of the trench 34d and consequently shields the corners of the base 36d of the trench 34d from the highly directional anisotropic plasma etch process. This has the effect of reducing the etch rate at the peripheral region 46 of the bottom surface (compared to a central region 48 of the bottom surface). As a result, a trench 34d can be formed whereby the base 36d of the trench 34d has rounded corners, a tapered profile, or a rounded profile in an edge region 50 and a substantially flat central region 48. By controlling the rate of deposition of the passivation material 44 (and hence by controlling the dimension of the opening in the mask) it is possible to control the profile at the base 36d of the feature 34d as desired.

Furthermore, the passivation material 44 that is deposited around the opening 40d of the trench 34d covers the rounded edges of the substrate 30d, protecting the rounded edges from the plasma and preventing further etching of the rounded edges. This allows the rounded edges of the substrate 30d at the opening 40d of the trench 34d to be maintained, whilst providing the controlled profile at the base 36d of the trench 34d.

Once the trench 34d is fully formed, a further deposition-stripping step (shown as "Step 4" on FIG. 4) is performed to remove the passivation material 44 from the surface 42d of the mask 32 and trench 34d. The removal of the passivation material 44 can be performed using wet etching. For example, HF can be used as a wet etchant to remove the passivation material and, if required, the mask 32. Alternatively, removal of the passivation material 44 may be performed using dry etching.

The resultant substrate 30e comprises a fully formed feature 34e which has an opening 40e having rounded edges and a base 36e having a substantially flat central region 48 and rounded or smoothed corners in an edge region 50 (or other shape as desired). A substrate which has an opening with a smoothed profile and/or a base or bottom surface with a smoothed profile (e.g. with rounded corners) can help to minimise field bunching. That is, the electric field is more uniformly dispersed about the feature. This can help to maximise breakdown voltages. Additionally, the present method helps to avoid the formation of micro-trenches at the corners of the feature being etched.

In order to control the profile of the base of the feature, it is necessary to control the rate of deposition of the passivation material 44. Typically, the third plasma etch step includes increasing the rate of deposition of the passivation material 44 as the third plasma etch step proceeds. The rate of deposition of the passivation material 44 can be controlled by varying one of the plasma process parameters. Any process parameter, including one or more of gas ratios, gas flow rates, etch time, plasma source power, platen power, and/or frequency of power applied, can be varied to control the deposition rate of the passivation material 44. For example, the deposition rate of the passivation material 44 can be increased by gradually increasing (i.e. ramping) the rate of a gas that forms the passivation material 44 (i.e. a passivation material precursor), such as an oxygen gas, introduced into the etch chamber 23 during the third plasma etch step. In a further example, the rate of deposition of the passivation material 44 can be increased by gradually reducing (i.e. ramping) the power applied to the platen 22 during the third plasma etch step.

Figure 5:
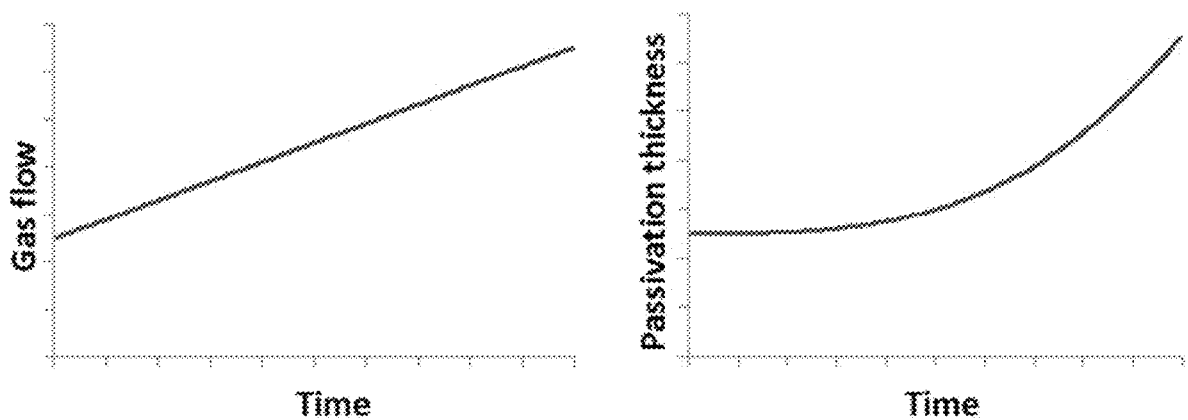
FIG. 5 shows how the passivation thickness changes with a linear increase in flow rate of a passivation material precursor.
Figure 6:
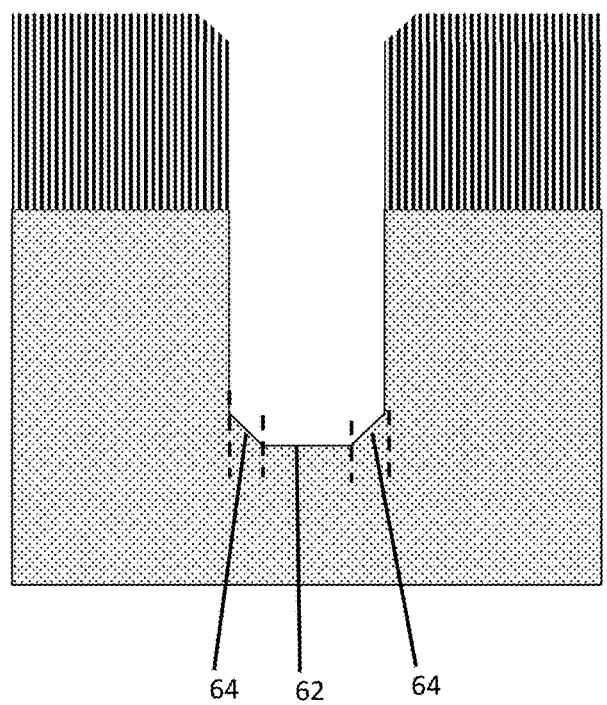
FIG. 6 shows a schematic cross-sectional view of a substrate comprising a feature having a base with tapered corners.

FIG. 5 shows how a linear increase in passivation material precursor gas flow rate during the third plasma etch step corresponds to a change in passivation thickness $t_p$. The linear increase in passivation material precursor flow rate results in a trench having a base with a tapered profile, as shown in FIG. 6. That is, the slope at the corner of the feature (i.e. in the edge region 64) is substantially constant. The bottom surface of the feature comprises the tapered corners 64 and the substantially flat central region 62. Without wishing to be bound by any theory or conjecture, the parts of the feature that are covered by the passivation material (for example, where the passivation material overhangs the base of the feature) have a reduced etch rate. Consequently, as the passivation material thickness increases, this has the effect of reducing the dimension of the opening in the mask layer, and so the etchable width (w) at the base of the feature gradually decreases accordingly. This causes a tapered profile at the base of the feature.

Figure 7:
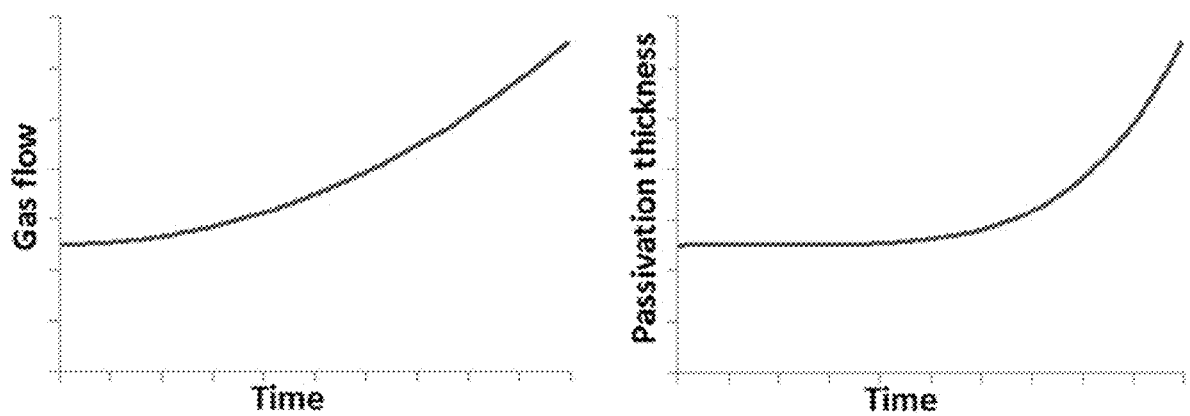
FIG. 7 shows how the passivation thickness changes with a non-linear increase in flow rate of a passivation material precursor.
Figure 8:
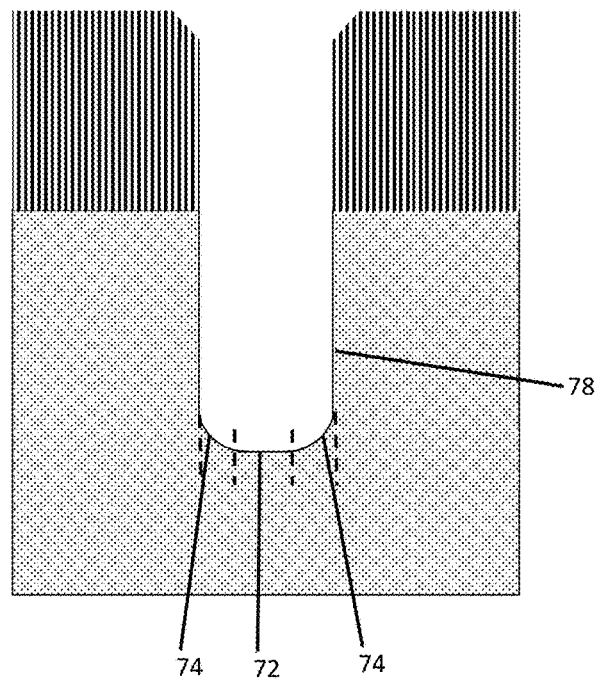
FIG. 8 shows a schematic cross-sectional view of a substrate comprising a feature having a base with rounded corners.

FIG. 7 shows how a non-linear increase in passivation material precursor gas flow rate corresponds to a change in passivation thickness. More specifically, the gas flow of FIG. 7 is increased (i.e. ramped) during the third plasma etch step at an increasing rate of change. The non-linear ramped increase in passivation material precursor gas flow rate results in a trench having a bottom surface having rounded corners. That is, the slope of the bottom surface in the edge region 74 gradually changes from horizontal (at the central region 72) to substantially vertical (at the sidewall 78), as shown in FIG. 8.

Figure 9:
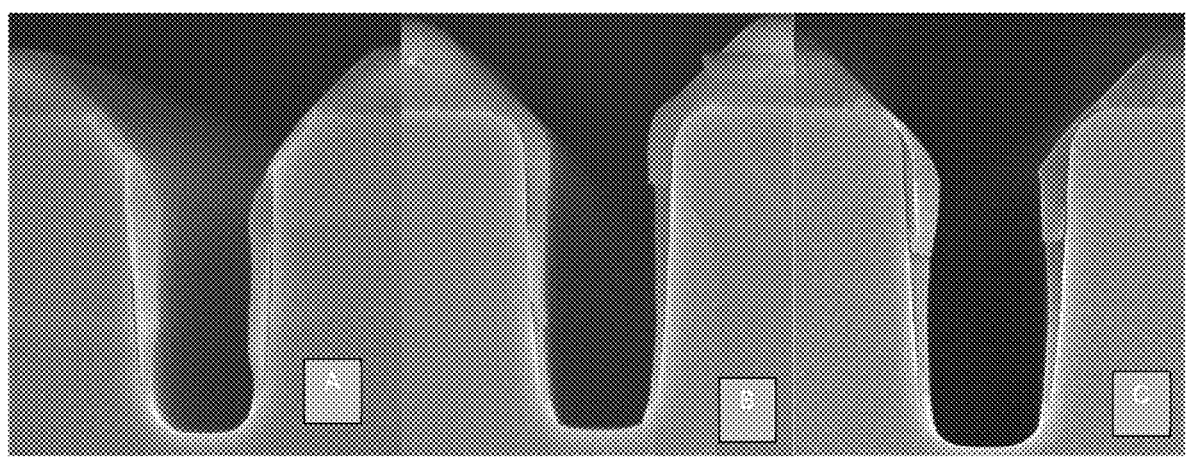
FIG. 9 shows a series of SEM images of features of a substrate having varying amount of passivation.

A gradual change in the angle of the edges of the substrate at the opening of the feature and the corners of the bottom surface of the feature is not necessarily guaranteed if the net deposition rate of the passivation material is not controlled. FIG. 9 shows example SEM images of trenches produced with: insufficient passivation material to protect the edges of the opening of the feature (labelled A); excessive passivation material deposition causing notched or tapered base corners (labelled B); and a balance of protection of the edges of the opening and base corner smoothness (labelled C).

As shown in FIG. 9, if too little passivation material is deposited on the edges of the opening during the third etching step, the edges are insufficiently protected from the plasma, causing further etching and resulting in a chamfered structure. If, on the other hand, too much passivation material is deposited on the edges of the opening during the third etching step, then the plasma is unable to etch the base of the trench in the desired manner, causing notched or tapered base corners.

Achieving a balance between these two scenarios, and obtaining the preferred rounded edges at the opening of the feature and rounded corners at the base of the feature, may be difficult to achieve without fine control of the net deposition rate of passivation material, because the material that may be etched by the plasma at the opening and base of the feature is the same.

Figure 10:
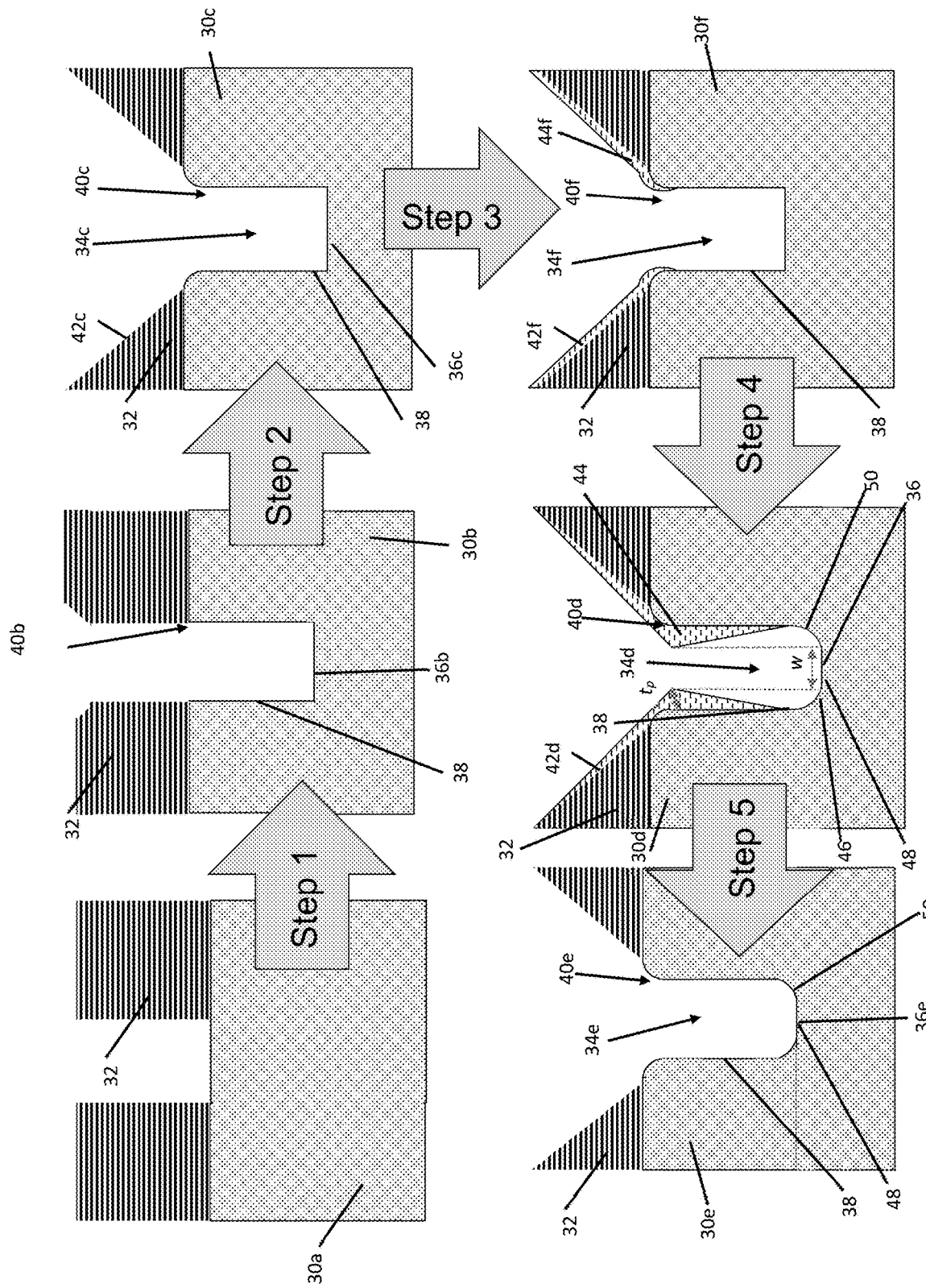
FIG. 10 shows a schematic cross-sectional view of a substrate at various stages of processing in accordance with a second aspect of the first embodiment of the invention.

To overcome this problem, the present inventors have proposed a second aspect of the method of the first embodiment of the present invention. FIG. 10 shows the stages of an exemplary method according to this second aspect of the first embodiment of the present invention. The features of the second aspect in common with the first aspect are labelled with the same reference numerals as those in the first aspect.

The second aspect of the first embodiment of the present invention includes an intermediate passivation step between the second plasma etch step and the third plasma etch step. This passivation step comprises depositing a passivation material onto the edges of the substrate at the opening of the partially formed feature. The passivation may be the same as the passivation material deposited during the third plasma etch step.

The passivation step may include using a gas composition comprising a chlorine-containing gas, optionally wherein the chlorine-containing gas is SiCl$_4$. The gas composition may additionally comprise H$_2$ gas and/or Ar gas. A bias power applied to the substrate during the passivation step can be lower than a bias power applied to the substrate at the beginning of the third plasma etch step. The bias power applied to the substrate during the passivation step can be lower than a bias power applied to the substrate throughout the third plasma etch step. The bias power applied to the substrate during the passivation step can be between about 100 W and about 200 W. The bias power applied to the substrate during the passivation step can be about 140 W. The bias power applied to the substrate during the passivation step may be an RF bias power. A plasma source power applied in the passivation step may be higher than a plasma source power applied in the third plasma etch step. The plasma source power applied in the passivation step may be between about 1500 W and about 2250 W. The plasma source power applied in the passivation step may be about 1850 W.

In the second aspect of the invention, as shown in FIG. 10, passivation material 44f is deposited onto the surface of mask 32 at the opening 40f of the partially-formed feature 34f during the passivation step, shown as "Step 3" in FIG. 10. As discussed above, the passivation material 44f may be the same as the passivation material 44 formed in the third plasma etch step ("Step 4" in FIG. 10). In this case, the passivation material 44f of the passivation step may serve as the surface on which the passivation material 44 of the third plasma etch step is deposited. The passivation step may be performed for between about 20 seconds and 80 seconds. The duration of the passivation step will depend on the critical dimension of the opening 40f, the relative thickness of the mask 32 to the depth of the feature 34f and the mask 32 material.

Similar to the third plasma etch step, the passivation step uses strongly passivating gases and low bias, but the conditions are even more passivation-rich. This ultra-high passivation step top-loads the passivation on the more exposed areas of the substrate, including the edges of the opening of the feature. Since the substrate has low bias applied to it, the passivation material is not forced down the feature towards the base and hence does not 'bread-loaf'. Therefore, the constriction of the feature opening is low. This passivation top-loading with reduced constriction of the opening protects the edges of the opening enough to avoid chamfering, while still allowing the base profile to vary smoothly from vertical to horizontal.

Example 1

An exemplary set of process parameters for the second and third plasma etch steps and the passivation step of the method of the first embodiment are shown in Table 1. The exemplary process was performed in the modified Omega® Synapse™ etch apparatus with source and bias RF power supplies operating at 13.56 MHz.

TABLE 1

| Process Parameter | Second Plasma Etch | Passivation Step | Third Plasma Etch |
| --- | --- | --- | --- |
| Pressure (mTorr) | 4 | 6 | 6 |
| ICP Source Power (Watts) | 1600 | 1850 | 1500 |
| Platen power (Watts) | 600 | 140 | 180 |
| Ar flow (sccm) | 0 | 50 | 25 |
| O$_2$ flow (sccm) | 0 | 30 | 45 |
| CF$_4$ flow (sccm) | 90 | 0 | 0 |
| SiCl$_4$ flow (sccm) | 0 | 80 | 105 |

Using the ICP etch system which is configured for 150 mm SiC wafers, typical process times for the second plasma etch step, the passivation step and the third plasma etch step for 2 μm deep trenches with a 1 μm critical dimension would be around 200-300 seconds.

Figure 1:
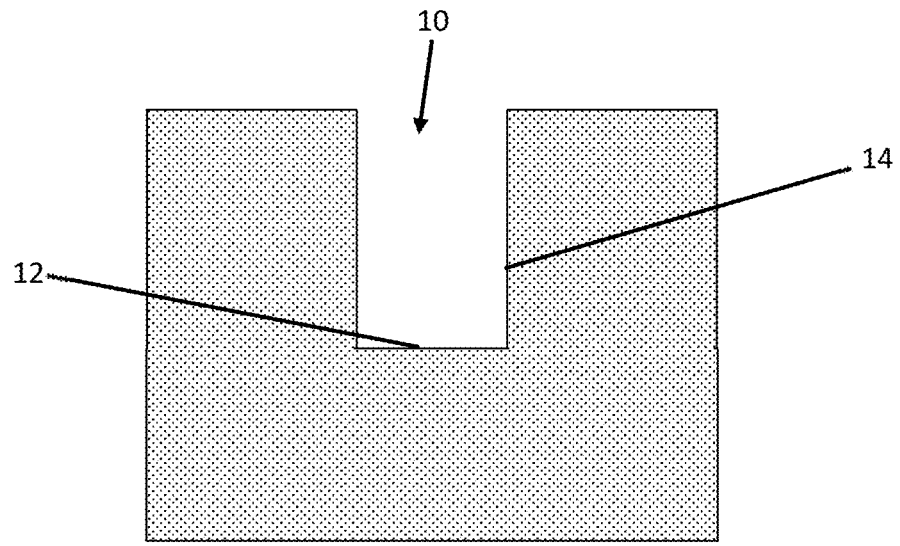
FIG. 1 is a cross-sectional schematic view of a trench having a base with angled (square) corners (prior art)
Figure 2:
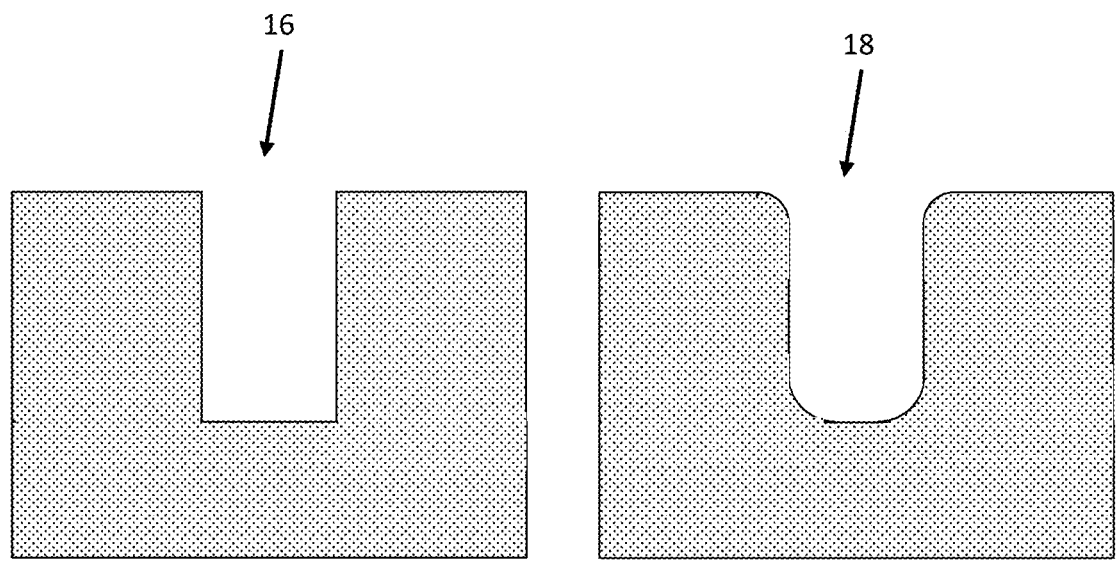
FIG. 2 is a cross-sectional schematic view of two trenches, the first having a base and sidewalls intersecting at an angle of 90° and the second having a base with rounded corners and an opening with rounded edges (prior art)

The method of the first embodiment of the present invention can provide features having rounded edges of the opening of the features and rounded corners at the base of the feature in the same manner as exemplary trench 18 as shown in FIG. 2 and the feature labelled C in FIG. 9.

By controlling the deposition rate of the passivation material, and hence by controlling the thickness of the passivation material, the dimension of the opening in the mask can be controlled. Control of this dimension allows the width of the etch at the base of the feature to be controlled, and can enable the shape of the bottom surface of the feature being etched to be controllably varied. Furthermore, controlling the deposition rate of the passivation material allows control of protection of the rounded edges of the opening, thereby determining the shape of the edges of the opening in the final feature. The present method allows a feature, such as a trench, having a bottom surface and opening with a controllable profile to be formed. Particular advantages are associated with a trench comprising a base and opening with rounded corners. A rounded (or curved) corner can more uniformly distribute electric fields and therefore reduce field bunching. This can beneficially maximise breakdown voltages. Additionally, the present method can prevent the formation of micro-trenching at the corners of a feature because the etch rate is reduced in the corner of features during the third plasma etch step.

The invention claimed is:

1. A method of plasma etching a compound semiconductor substrate to form a feature, the method comprising the steps of:
providing a substrate with a mask formed thereon, the mask having a mask opening, wherein the substrate is formed from a compound semiconductor material, and wherein the mask includes silicon dioxide;
performing a first plasma etch step to anisotropically etch the substrate through the mask opening to produce a majority of a partially formed feature having an opening and a bottom surface comprising a peripheral region;
performing a second plasma etch step to remove a region of the mask adjacent to the opening of the partially formed feature and thereby cause rounding of the edges of the substrate at the opening of the partially formed feature; and
performing a third plasma etch step to anisotropically etch the bottom surface of the partially formed feature through the mask opening of the mask while depositing a passivation material onto the mask and the opening of the partially formed feature so as to reduce a dimension of the opening of the partially formed feature, wherein the reduction of the dimension of the opening of the partially formed feature causes an attenuation in etching of the peripheral region and the opening of the partially formed feature thereby producing a fully formed feature having an opening with rounded edges, a bottom surface comprising a central region and an edge region, wherein the central region is deeper than the edge region of the bottom surface of the fully formed feature.

2. The method according to claim 1, wherein the second plasma etch step includes using an etch recipe comprising a fluorocarbon-based etchant.

3. The method according to claim 2, wherein the fluorocarbon-based etchant comprises $CF_4$, $CHF_3$ or $C_4F_8$.

4. The method according to claim 1, wherein a bias power applied to the substrate during the second plasma etch step is between 350 W and 1000 W.

5. The method according to claim 1, wherein the second plasma etch step is carried out at a pressure of between 2 and 10 mTorr.

6. The method according to claim 1, wherein a net deposition rate of the passivation material throughout the third plasma etch step is greater than zero.

7. The method according to claim 1, wherein the third plasma etch step comprises varying at least one process parameter during the third plasma etch step.

8. The method according to claim 1, wherein the passivation material comprises a silicon oxide.

9. The method according to claim 1, wherein the passivation material and the mask are made of substantially the same material.

10. The method according to claim 1, wherein the third plasma etch step includes using an etch recipe comprising a chlorine-based etchant.

11. The method according to claim 10, wherein the chlorine-based etchant comprises $Cl_2$ and/or $SiCl_4$.

12. The method according to claim 1, wherein the method further comprises a passivation step after the second plasma etch step and before the third plasma etch step, wherein the passivation step comprises depositing a passivation material onto the edges of the substrate at the opening of the partially formed feature.

13. The method according to claim 12, wherein the passivation material is the same as the passivation material deposited during the third plasma etch step.

14. The method according to claim 12, wherein a bias power applied to the substrate during the passivation step is lower than a bias power applied to the substrate at the beginning of the third plasma etch step.

15. The method according to claim 12, wherein the passivation step includes using a gas composition comprising oxygen.

16. The method according to claim 12, wherein the passivation step includes using a gas composition comprising a chlorine-containing gas.

17. The method according to claim 16, wherein the chlorine-containing gas is $SiCl_4$.

18. The method according to claim 12, wherein the passivation step includes using a gas composition comprising $H_2$ gas and/or Ar gas.

19. The method according to claim 12, wherein a plasma source power applied in the passivation step is higher than a plasma source power applied in the third plasma etch step.

20. The method according to claim 1, wherein the feature is a trench.

21. The method according to claim 1, wherein the edge region of the bottom surface of the fully formed feature comprises a curved surface, optionally wherein the edge region forms a rounded corner between the central region of the bottom surface and a sidewall of the fully formed feature.

22. The method according to claim 1, wherein the compound semiconductor substrate is a silicon carbide (SiC) wafer.

23. The method according to claim 1, further comprising selectively removing the passivation material from the substrate by wet etching.

24. The method according to claim 1, wherein the first plasma etch step, the second plasma etch step and the third plasma etch step are performed using an inductively coupled plasma (ICP) etch apparatus.

* * * * *